US009837209B2

(12) United States Patent
Hwang et al.

(10) Patent No.: US 9,837,209 B2
(45) Date of Patent: Dec. 5, 2017

(54) CAPACITOR STRUCTURE FOR WIDEBAND RESONANCE SUPPRESSION IN POWER DELIVERY NETWORKS

(71) Applicant: QUALCOMM Incorporated, San Diego, CA (US)

(72) Inventors: Kyu-Pyung Hwang, San Diego, CA (US); Young K. Song, San Diego, CA (US); Changhan Yun, San Diego, CA (US); Dong Wook Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1003 days.

(21) Appl. No.: 13/684,072

(22) Filed: Nov. 21, 2012

(65) Prior Publication Data

US 2014/0139969 A1 May 22, 2014

(51) Int. Cl.
*H01G 4/00* (2006.01)
*H01G 4/30* (2006.01)
(Continued)

(52) U.S. Cl.
CPC ............. *H01G 4/002* (2013.01); *H01G 4/012* (2013.01); *H01G 4/33* (2013.01); *H01L 23/50* (2013.01);
(Continued)

(58) Field of Classification Search
CPC .......... H01G 4/30; H01G 4/232; H01G 4/005; H01G 4/224
(Continued)

(56) References Cited

U.S. PATENT DOCUMENTS 1,899,176 A  2/1933  Bailey
5,208,726 A  5/1993  Apel
(Continued)

FOREIGN PATENT DOCUMENTS

EP  1075004 A1  2/2001
JP  4034950 A   2/1992

OTHER PUBLICATIONS

International Search Report and Written Opinion—PCT/US2013/071352—ISA/EPO—Apr. 23, 2014.

*Primary Examiner* — Jenny L Wagner
*Assistant Examiner* — Arun Ramaswamy
(74) *Attorney, Agent, or Firm* — Withrow & Terranova, PLLC

(57) ABSTRACT

Some novel features pertain to a capacitor structure that includes a first conductive layer, a second conductive layer and a non-conductive layer. The first conductive layer has a first overlapping portion and a second overlapping portion. The second conductive layer has a third overlapping portion, a fourth overlapping portion, and a non-overlapping portion. The third overlapping portion overlaps with the first overlapping portion of the first conductive layer. The fourth overlapping portion overlaps with the second overlapping portion of the first conductive layer. The non-overlapping portion is free of any overlap (e.g., vertical overlap) with the first conductive layer. The non-conductive layer separates the first and second conductive layers. The non-conductive layer electrically insulates the third overlapping portion and the fourth overlapping portion from the first conductive layer.

30 Claims, 17 Drawing Sheets

(51) Int. Cl.
  *H01G 4/005* (2006.01)
  *H01G 4/232* (2006.01)
  *H01G 4/224* (2006.01)
  *H01G 4/002* (2006.01)
  *H01G 4/012* (2006.01)
  *H01G 4/33* (2006.01)
  H01L 23/50 (2006.01)

(52) U.S. Cl.
  CPC ......... *H01L 2224/16225* (2013.01); *H01L 2224/32225* (2013.01); *H01L 2224/73204* (2013.01); *H01L 2924/15311* (2013.01); *H01L 2924/19105* (2013.01); *Y10T 29/417* (2015.01)

(58) Field of Classification Search
  USPC .............. 361/301.4, 301.1, 303; 29/25.03
  See application file for complete search history.

(56) References Cited

U.S. PATENT DOCUMENTS

| | | |
|---|---|---|
| 6,266,227 B1 | 7/2001 | Konushi et al. |
| 6,414,369 B1 * | 7/2002 | Battersby ............ H01L 23/60 |
| | | 257/355 |
| 2004/0179325 A1 | 9/2004 | Togashi et al. |
| 2005/0116277 A1 | 6/2005 | Schrenk |
| 2007/0222031 A1 | 9/2007 | Jow et al. |
| 2008/0013250 A1 | 1/2008 | Aoki |
| 2008/0106845 A1 * | 5/2008 | Kunimatsu et al. ......... 361/303 |
| 2008/0174934 A1 | 7/2008 | Togashi |
| 2008/0239624 A1 | 10/2008 | Togashi |
| 2010/0033897 A1 | 2/2010 | Lee et al. |

* cited by examiner

TOP VIEW
WITH NON-
CONDUCTIVE
ELEMENTS
SHOWN

SIDE VIEW

TOP VIEW
WITH NON-
CONDUCTIVE
ELEMENTS
SHOWN

SIDE VIEW

CAPACITOR STRUCTURE FOR WIDEBAND RESONANCE SUPPRESSION IN POWER DELIVERY NETWORKS

BACKGROUND

Field

Various features relate to capacitor structure for wideband resonance suppression in power delivery networks.

Background

In modern electronics, Power Delivery Networks (PDNs) are used to deliver power from a power supply to ICs. PDNs inherently suffer from resonance, which interfere with the ICs the PDNs are meant to power. One solution to avoid or minimize this interference is to use a circuit to decouple power supplies from PDNs. Existing decoupling solutions for PDNs are based on Multi-Layer Ceramic Capacitors (MLCCs). However, each MLCC may only suppress one resonance. As such, the MLCC approach cannot provide wideband suppression of PDN resonances unless multiple capacitors are used. Given the ever limited space in electronic device packaging, however, there may not be space for the multiple MLCCs needed to provide wideband resonance suppression.

Therefore, there is a need for single capacitor structure capable of providing a decoupling solution over a wideband of resonance frequencies in PDNs. Ideally, such a single capacitor structure may be integrated in a package.

SUMMARY

Various features apparatus and methods described herein provide a capacitor structure.

A first example provides a capacitor structure that includes a first conductive layer, a second conductive layer and a non-conductive layer. The first conductive layer has a first overlapping portion and a second overlapping portion. The second conductive layer has a third overlapping portion, a fourth overlapping portion, and a non-overlapping portion. The third overlapping portion overlaps with the first overlapping portion of the first conductive layer. The fourth overlapping portion overlaps with the second overlapping portion of the first conductive layer. The non-overlapping portion is free of any overlap (e.g., vertical overlap) with the first conductive layer. The non-conductive layer separates the first and second conductive layers. The non-conductive layer electrically insulates the third overlapping portion and the fourth overlapping portion from the first conductive layer.

According to one aspect, the non-conductive layer includes a first non-conductive element and a second non-conductive element. The first non-conductive element is arranged in the capacitor structure so as to overlap with the third overlapping portion of the second conductive layer. The second non-conductive element is arranged in the capacitor structure so as to overlap with the fourth overlapping portion of the second conductive layer.

According to another aspect, the first conductive layer, the non-conductive layer, and the second conductive layer are configured to form a single embedded passive substrate (EPS) element with capacitive properties.

According to yet another aspect, at least a portion of the non-overlapping portion of the second conductive layer is on the same layer as the first conductive layer. In some implementations, the non-overlapping portion of the second conductive layer has an inductive property. The inductive property of the non-overlapping portion of the second conductive layer is based on a non-linear shape of the non-overlapping portion of the second conductive layer in some embodiments.

According to one aspect, the first overlapping portion of the first conductive layer, a first portion of the non-conductive layer, and the third overlapping portion of the second conductive layer has a first capacitive property. In some implementations, the second overlapping portion of the first conductive layer, a second portion of the non-conductive layer, and the fourth overlapping portion of the second conductive layer has a second capacitive property.

In some implementations, the first conductive layer, the second conductive layer, and the non-conductive layer are layers of a die.

A second example provides a method for manufacturing a capacitor structure. The method defines a first conductive layer that has a first overlapping portion and a second overlapping portion. The method defines a non-conductive layer separating the first conductive layer and a second conductive layer. The non-conductive layer is for electrically insulating the second conductive layer from the first conductive layer. The method defines a second conductive layer that has a third overlapping portion, a fourth overlapping portion, and a non-overlapping portion. The third overlapping portion overlaps with the first overlapping portion of the first conductive layer. The fourth overlapping portion overlaps with the second overlapping portion of the first conductive layer. The non-overlapping portion is free of any overlap (e.g., vertical overlap) with the first conductive layer.

According to one aspect, defining the non-conductive layer includes defining a first non-conductive element and a second non-conductive element. The first non-conductive element is arranged in the capacitor structure so as to overlap with the third overlapping portion of the second conductive layer. The second non-conductive element is arranged in the capacitor structure so as to overlap with the fourth overlapping portion of the second conductive layer.

According to another aspect, the non-overlapping portion of the second conductive layer has an inductive property. The inductive property of the non-overlapping portion of the second conductive layer may be based on a non-linear shape of the non-overlapping portion of the second conductive layer.

According to yet another aspect, defining the first conductive layer includes defining the first conductive layer on a first layer of a die. In some implementations, defining the non-conductive layer includes defining the non-conductive layer on a second layer of a die. In addition, defining the second conductive layer may include defining the first conductive layer on a third layer of a die. In some implementations, defining the second conductive layer may include defining the first and second overlapping portions of the first conductive layer on a third layer of a die and defining some or all of the non-overlapping portion on the first layer of the die.

A third example provides an apparatus for manufacturing a capacitor structure. The apparatus includes means for defining a first conductive layer that has a first overlapping portion and a second overlapping portion. The apparatus includes means for defining a non-conductive layer separating the first conductive layer and a second conductive layer. The non-conductive layer is for electrically insulating the second conductive layer from the first conductive layer. The apparatus also includes means for defining a second conductive layer that has a third overlapping portion, a fourth overlapping portion, and a non-overlapping portion. The third overlapping portion overlaps with the first overlapping portion of the first conductive layer. The fourth overlapping portion overlaps with the second overlapping portion of the first conductive layer. The non-overlapping portion is free of any overlap (e.g., vertical overlap) with the first conductive layer.

According to one aspect, the means for defining the non-conductive layer includes a means for defining a first non-conductive element and a second non-conductive element. The first non-conductive element is arranged in the capacitor structure so as to overlap with the third overlapping portion of the second conductive layer. The second non-conductive element is arranged in the capacitor structure so as to overlap with the fourth overlapping portion of the second conductive layer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a capacitor structure that includes a first conductive layer, a second conductive layer and a non-conductive layer. The first conductive layer has a first overlapping portion and a second overlapping portion. The second conductive layer has a third overlapping portion, a fourth overlapping portion, and a non-overlapping portion. The third overlapping portion overlaps with the first overlapping portion of the first conductive layer. The fourth overlapping portion overlaps with the second overlapping portion of the first conductive layer. The non-overlapping portion is free of any overlap (e.g., vertical overlap) with the first conductive layer. The non-conductive layer separates the first and second conductive layers. The non-conductive layer electrically insulates the third overlapping portion and the fourth overlapping portion from the first conductive layer. In some implementations, the capacitor structure is integrated in a die, a package, and/or a substrate. The non-overlapping portion of the second conductive layer may have an inductive property.

Some novel features also pertain to a capacitor structure that includes a first conductive layer, a second conductive layer, and a set of non-conductive elements. The second conductive layer includes first and second portions that overlap the first conductive layer. The second conductive layer also includes a third non-overlapping portion electrically coupling the first and second portions, where the third portion does not overlap the first conductive layer. The set of non-conductive elements separates the first conductive layer and the second conductive layer. Each of the first and second portions of the second conductive layer that overlaps the first conductive layer is electrically insulated from the first conductive layer.

Exemplary Wideband Capacitor for Package

Figure 1:
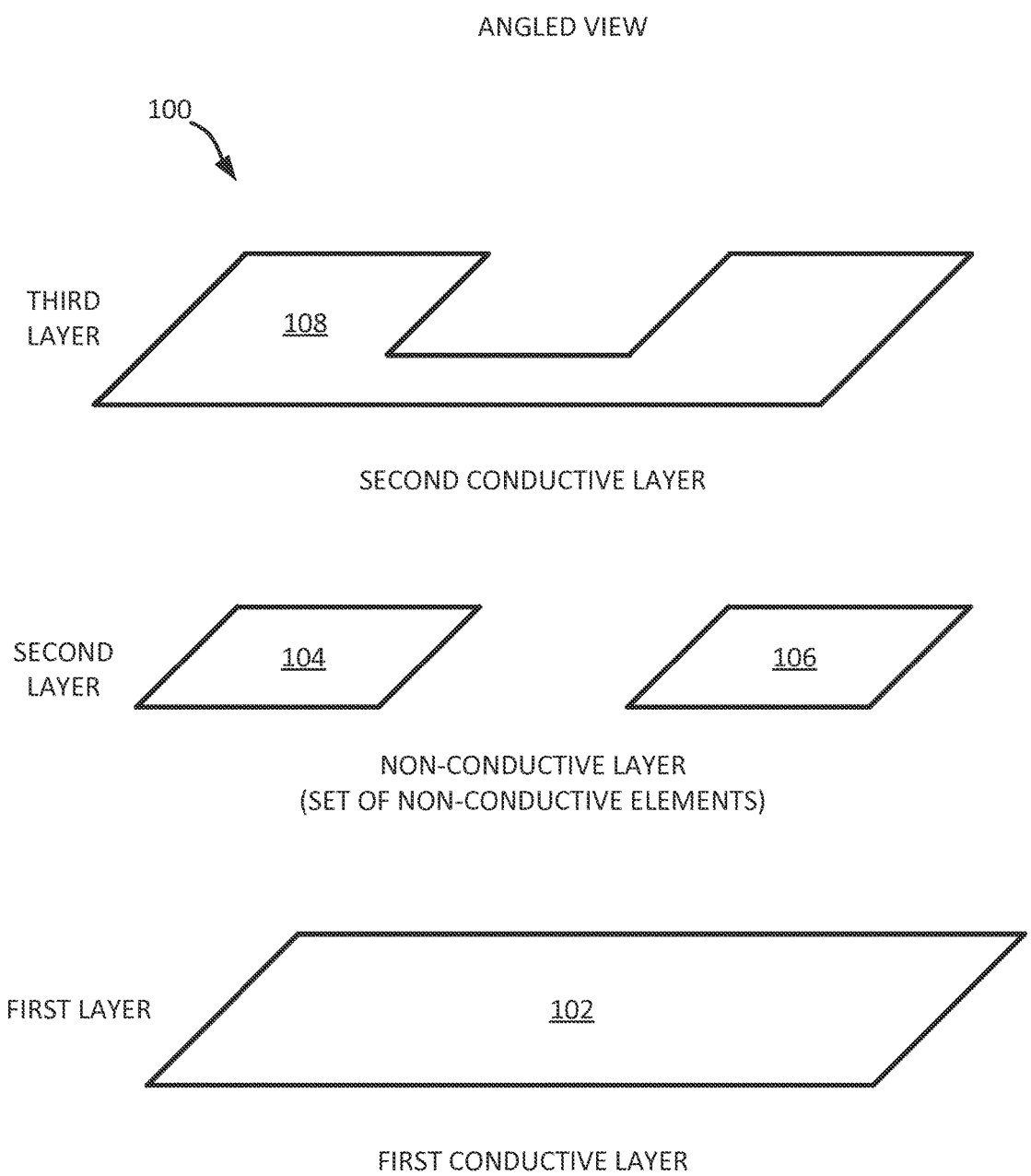
FIG. 1 illustrates an angled view of various elements and/or components of a capacitor structure.

FIG. 1 conceptually illustrates an angled view of some of the various elements of a capacitor structure in some implementations. As shown in FIG. 1, the capacitor structure 100 includes a first conductive layer 102, a set of non-conductive elements 104-106, and a second conductive layer 108. The set of non-conductive elements 104-106 is located between the first conductive layer 102 and the second conductive layer 108. The set of non-conductive elements 104-106 may be located on the same layer. In some implementations, the set of non-conductive elements 104-106 is made of aluminum oxide ($Al_2O_3$). However, different implementations may use different non-conductive materials for the set of non-conductive elements 104-106. Similarly, different implementations may use different conductive materials for the first and second conductive layers 102 and 108. For example, the first and second conductive layers 102 and 108 may be a metal layer (e.g., copper).

In some implementations, the capacitor structure 100 is defined by placing the set of non-conductive elements 104-106 above (e.g., on top) of the first conductive layer 102 and then placing the second conductive layer above (e.g., on top) of the set of non-conductive elements 104-106. Different embodiments may place the first conductive layer, the second conductive layer, and the set of non-conductive elements differently.

Figure 2:
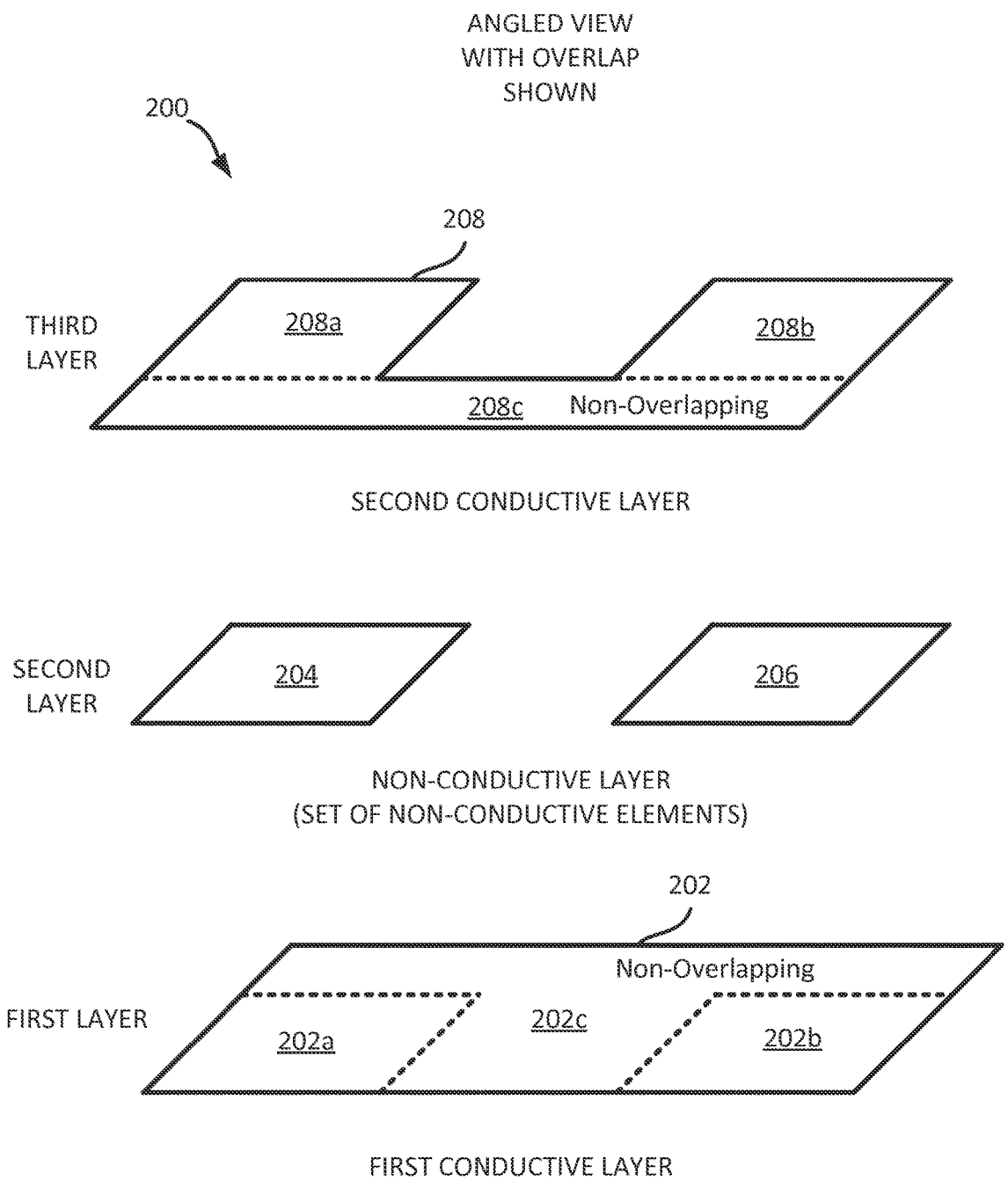
FIG. 2 illustrates an angled view with overlap shown of various elements and/or components of a capacitor structure.

FIG. 2 illustrates an example of how the different elements of a capacitor structure may be configured. As shown in FIG. 2, the capacitor structure 200 includes a first conductive layer 202, a set of non-conductive elements 204-206, and a second conductive layer 208. The set of non-conductive elements includes a first non-conductive element 204 and a second non-conductive element 206.

The first conductive layer 202 includes a first portion 202a, a second portion 202b, and a third portion 202c. As shown in FIG. 2, the first non-conductive element 204 is positioned above (e.g., on top) the first conductive layer 202 such that the first non-conductive element 204 overlaps with the first portion 202a of the first conductive layer 202. Similarly, the second non-conductive element 206 is positioned above (e.g., on top) the first conductive layer 202 such that the second non-conductive element 206 overlaps with the second portion 202b of the first conductive layer 202. Moreover, the third portion 202c (which has a T-shape) of the first conductive layer 202 does not overlap with either the set of non-conductive elements 204-206, nor the second conductive layer 208.

FIG. 2 illustrates that the second conductive layer 208 includes a first portion 208a, a second portion 208b, and a third portion 208c. In some implementations, the second conductive layer 208 is positioned above the set of non-conductive elements 204-206, such that the first portion 208a and the second portion 208b of the second conductive layer 208 overlap with the first non-conductive element 204 and the second non-conductive element 206, respectively. In addition, the third portion 208c of the second conductive layer 208 does not overlap with either the set of non-conductive elements 204-206, nor the first conductive layer 202.

In some implementations, the first portion 202a of the first conductive layer 202, the first non-conductive element 204, and the first portion 208a of the second conductive layer 208 define a first capacitor element (with capacitive properties) of the capacitor structure 200. Similarly, in some implementations, the second portion 202b of the first conductive layer 202, the second non-conductive element 206, and the second portion 208b of the second conductive layer 208 define a second capacitor element (with capacitive properties) of the capacitor structure 200. Additionally, in some implementations, the third portion 208c of the second conductive layer 208 may define an inductor element (with inductive properties) of the capacitor structure 200. The inductive properties of the third portion 208c may be adjusted by altering the shape of the third portion 208c. Thus, for example, the third portion 208c may be characterized by a non-linear shape with bends and/or angles.

In some embodiments, a capacitor structure that includes such a first capacitor element, a second capacitor element and an inductor element may provide a capacitor structure with wideband impedance properties. The impedance properties of a capacitor structure will further described below in the next section.

Before describing the impedance properties of a capacitor structure, different views of an exemplary capacitor structure will be further described.

Figure 3:
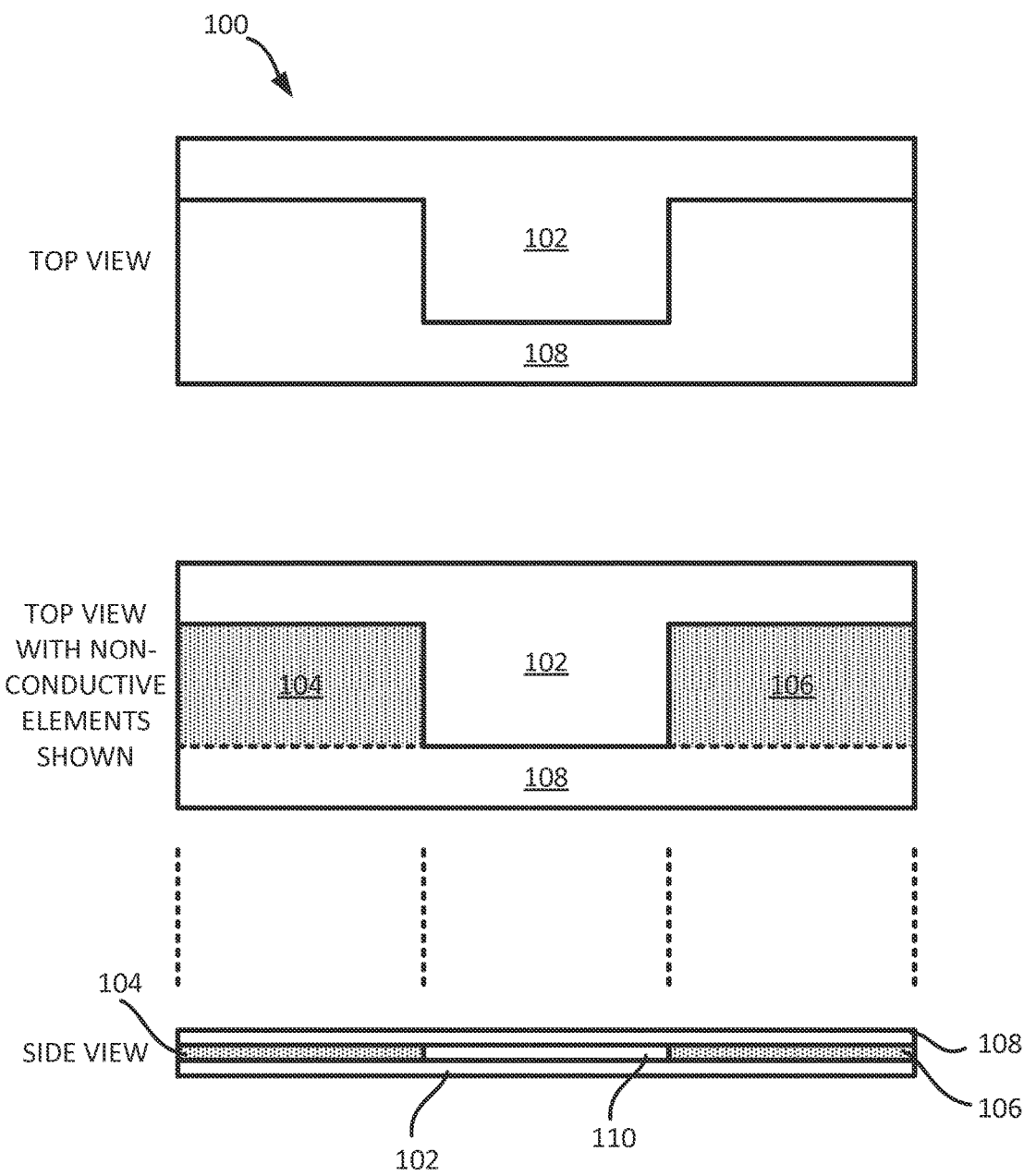
FIG. 3 illustrates a top view and a side view a capacitor structure.

FIG. 3 illustrates a top view and a side view of the capacitor structure of FIG. 1 after the elements/layers have been coupled together in some implementations. The top figure of FIG. 3 illustrates a top view of the capacitor structure 100. The top figure shows portions of the first conductive layer 102 and portions of the second conductive layer 108.

The middle figure of FIG. 3 also illustrates a top view of the capacitor structure 100. However, in the middle figure, the first and second non-conductive elements 104-106 are shown, even though they are located between the first conductive layer 102 and the second conductive layer 106. It should also be noted that the area represented by the first and second non-conductive elements 104-106 may also represent the area/portion of overlap between the first conductive layer 102, the first and second non-conductive elements 104-106, and/or the second conductive layer 108 in some embodiments.

The bottom figure of FIG. 3 illustrates a side view of the capacitor structure 100 of FIG. 1 in some implementations. The bottom figure illustrates that the first and second non-conductive elements 104-106 are between the first conductive layer 102 and the second conductive layer 108. The bottom figure of FIG. 3 also illustrates a region 110. The region 110 may be an empty region or gap (e.g., air) in the capacitor structure 100 in some implementations. However, in some implementations, the region 110 may be another component (e.g., dielectric component) which is created during the manufacturing of the capacitor structure.

Figure 4A:
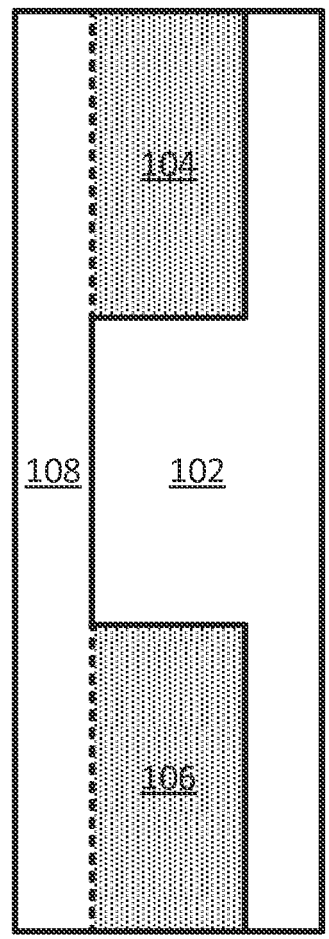
FIG. 4A illustrates another top view and another side view a capacitor structure.
Figure 4A:
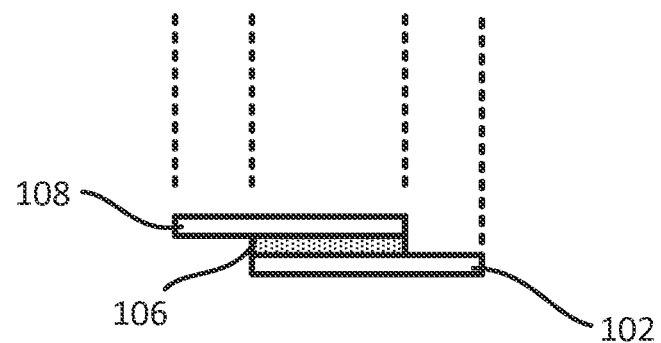

FIG. 4A illustrates another top view and another side view of the capacitor structure 100 in some embodiments. As shown in the side view of FIG. 4, the second non-conductive element 106 is positioned above (e.g., on top) of the first conductive layer 102. In addition, the second conductive layer 108 is positioned above the second non-conductive element 106. Although not visible in the side view, the first non-conductive layer 104 is positioned between the first conductive layer 102 and the second conductive layer 108. In some implementations, pins or electrodes (not shown) may be coupled the non overlapping regions of the first conductive layer 102 and the second conductive layer 108 (e.g., regions that do not overlap with either the first or second non-conductive elements 104-106).

Figure 4B:
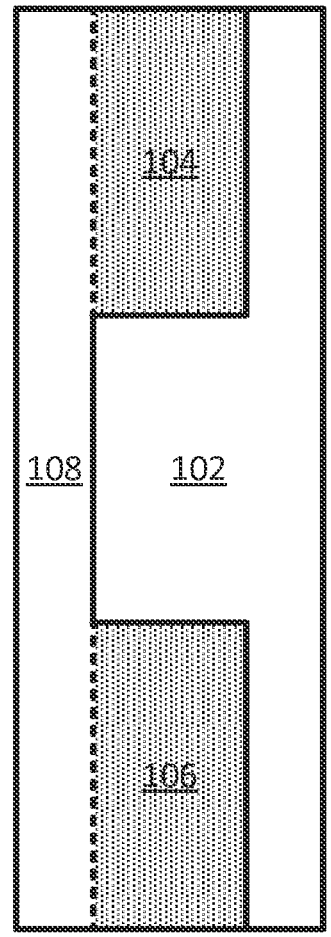
FIG. 4B illustrates yet another top view and another side view a capacitor structure.
Figure 4B:
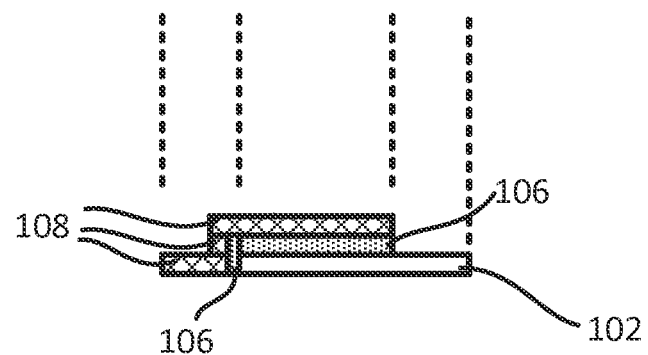

In some implementations, portions of the second conductive layer 108 may be located on different layers or different elevation/topology/level of the same layer. FIG. 4B illustrates another top view and side view of the capacitor structure 100 in some embodiments. FIG. 4B is similar to FIG. 4A, except that portions of the second conductive layer 108 are located on different layers (or different elevation/topology/level of the same layer). As shown in FIG. 4B, portions of the second conductive layer 108 are located above the non-conductive layer 104. In addition, another portion of the second conductive layer 108 is located on the same layer as the first conductive layer 102. In some implementations, the portion of the second conductive layer 108 that is located on the same layer as the first conductive layer 102 is the portion of the second conductive layer 108 that does not vertically overlap (free of any vertical overlap) with the first conductive layer 102. The second conductive layer 108 is electrically insulated from the first conductive layer 102 by using the non-conductive layer 106. As shown in FIG. 4B, a portions of the non-conductive layer 106 is also located on the same layer as the first conductive layer 102.

In summary, some implementations of a capacitor structure may be defined by a first layer, a second layer and a third layer. The first layer may include a first conductive layer 102, a portion of a non-conductive layer 106 and a portion of a second conductive layer 108. The second layer is above the first layer. The second layer may include another portion of the non-conductive layer 106. The non-conductive layer 106 may be one continuous layer/element (e.g., the non-conductive layer has not been patterned or separated) in some implementations. In other implementations, the non-conductive layer 106 be defined by several non-continuous elements (e.g., non-conductive elements 204-206), which may be patterned and/or separated during a manufacturing process. The non-continuous elements/portions may overlap with non-continuous portions of the first and third layers in some implementations. The second layer of the capacitor structure may also include another portion of the second conductive layer. The third layer of the capacitor structure is above the first and second layers of the capacitor structure. The third layer may include yet another portion of the second conductive layer 108.

Having described a configuration of a capacitor structure of some embodiments, the impedance (Z) of such a capacitor structure will now be described below.

Exemplary Impedance Property

As previously described above, a capacitor may be used as a decoupler/decoupling solution in a power delivery network (PDN). The effectiveness of a capacitor structure may be defined/characterized by its impedance property, which may be related to its ability to suppress resonance at one or more frequencies. A capacitor that is capable of suppressing one resonance (at one frequency) may be referred to as narrowband capacitor. On the other hand, a wideband capacitor may be defined as a capacitor that is capable of suppressing multiple resonances (at different frequencies). The more resonances the capacitor may suppress the higher the wideband capability of the capacitor.

Figure 5:
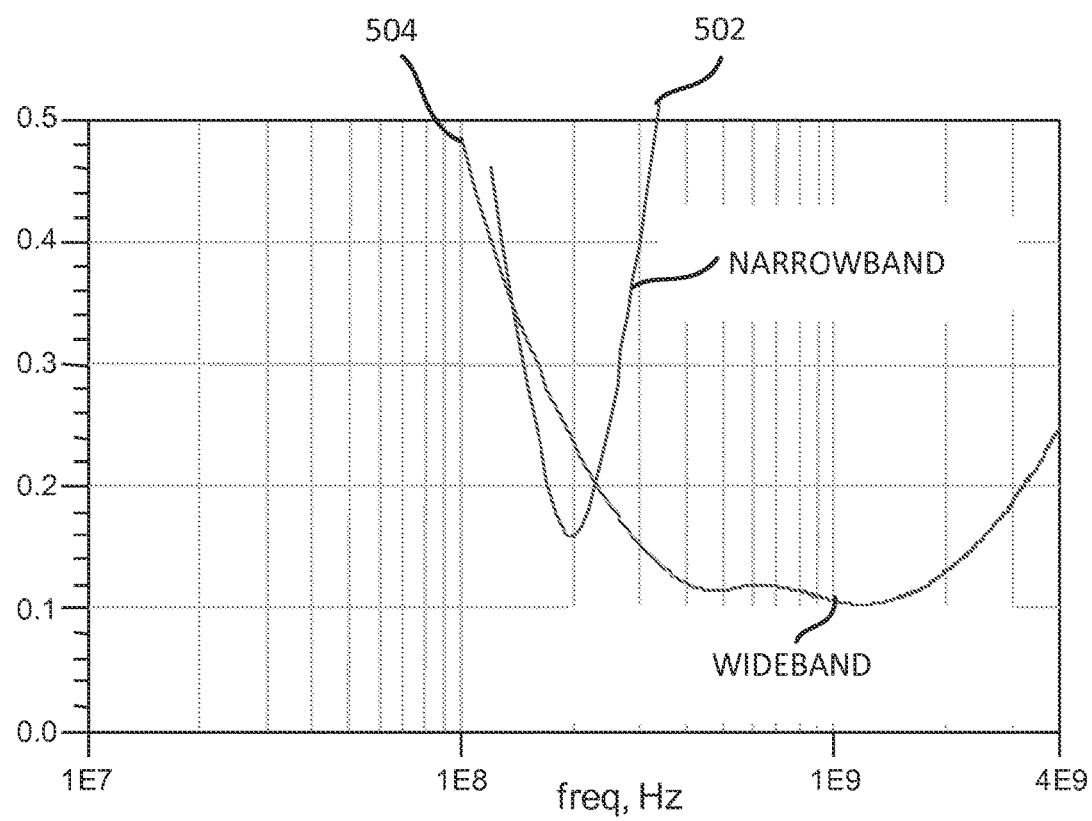
FIG. 5 illustrates a graph comparing the impedance of two capacitors of comparable size and dimensions.

FIG. 5 illustrates a graph with two different impedance characteristics. Specifically, FIG. 5 illustrates a first curve 502 and a second curve 504, characterizing the impedance property of a first capacitor and a second capacitor, respectively. The first capacitor may be a Multi-Layer Ceramic Capacitors (MLCCs). In some implementations, the second capacitor may be the capacitor structure of FIGS. 1-4. It should be noted that the graph of FIG. 5 is merely intended to illustrate and compare the performance between two similarly sized capacitors/capacitor structures (e.g., where the first capacitor and the second capacitor have similar dimensions and size). As such, FIG. 5 is not intended to limit the impedance/decoupling properties of the capacitor structure to a particular value and/or frequency.

As shown in FIG. 5, the first capacitor has a narrow band, which is illustrated by the small and/or narrow width at/or near the valley (near lowest point) of the curve 502. In contrast, the second capacitor (which may be the capacitor structure of FIGS. 1-4) has a wide width at/or near the valley (near lowest point) of the curve 504. This wide width indicates that the capacitor is capable of suppressing resonances at various frequencies (much more frequencies than the first capacitor, which is represented by the first curve 502).

As such, the disclosed approach provides a novel power decoupling capacitor capable of suppressing PDN resonances over a wide band of frequencies (i.e., a bandwidth). In some implementations, control of the size of the bandwidth is realized by using two thin films connected in parallel. Thus, the disclosed approach delivers wideband suppression of PDN resonances in a compact, single device. Instead of using a multiple number of MLCCs, which requires a large substrate area to implement wideband suppression, the disclosed approach delivers a simple and optimized PDN decoupling solution.

Thus, for capacitors of comparable size and dimensions, the capacitor structure described in the present disclosure provides a superior decoupling solutions for PDNs than current capacitors. This superior decoupling performance allows one capacitor structure to be used instead of several capacitors. The ability to use one capacitor structure is especially important and valuable when design considerations require small form factors. For example, many devices and/or components are manufactured in packages (e.g., System in Package (SiP)), which may have limited space. In such instances, it may not be possible to include more than one capacitor to provide decoupling capabilities for the PDNs.

Exemplary Capacitor Use

Figure 6:
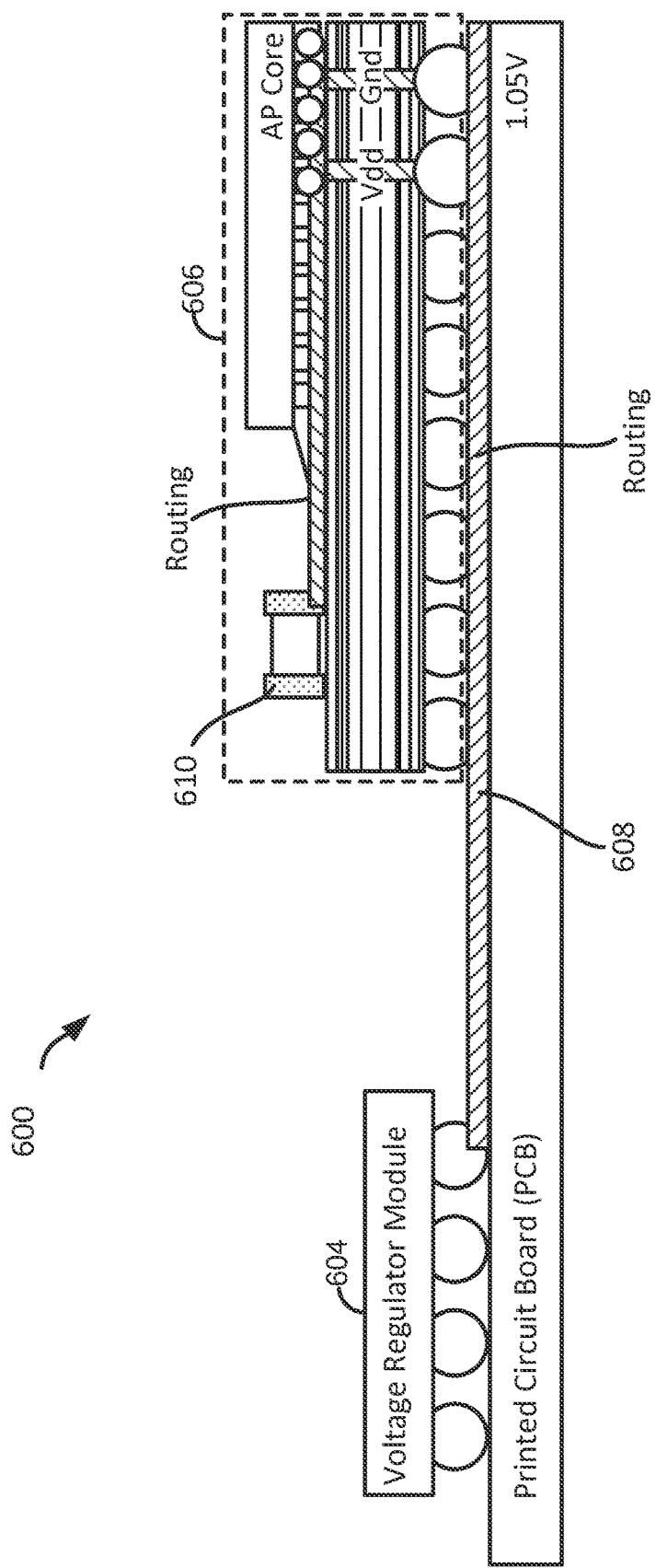
FIG. 6 illustrates a device that includes a package with a capacitor structure with wideband resonance suppression.
Figure 7A:
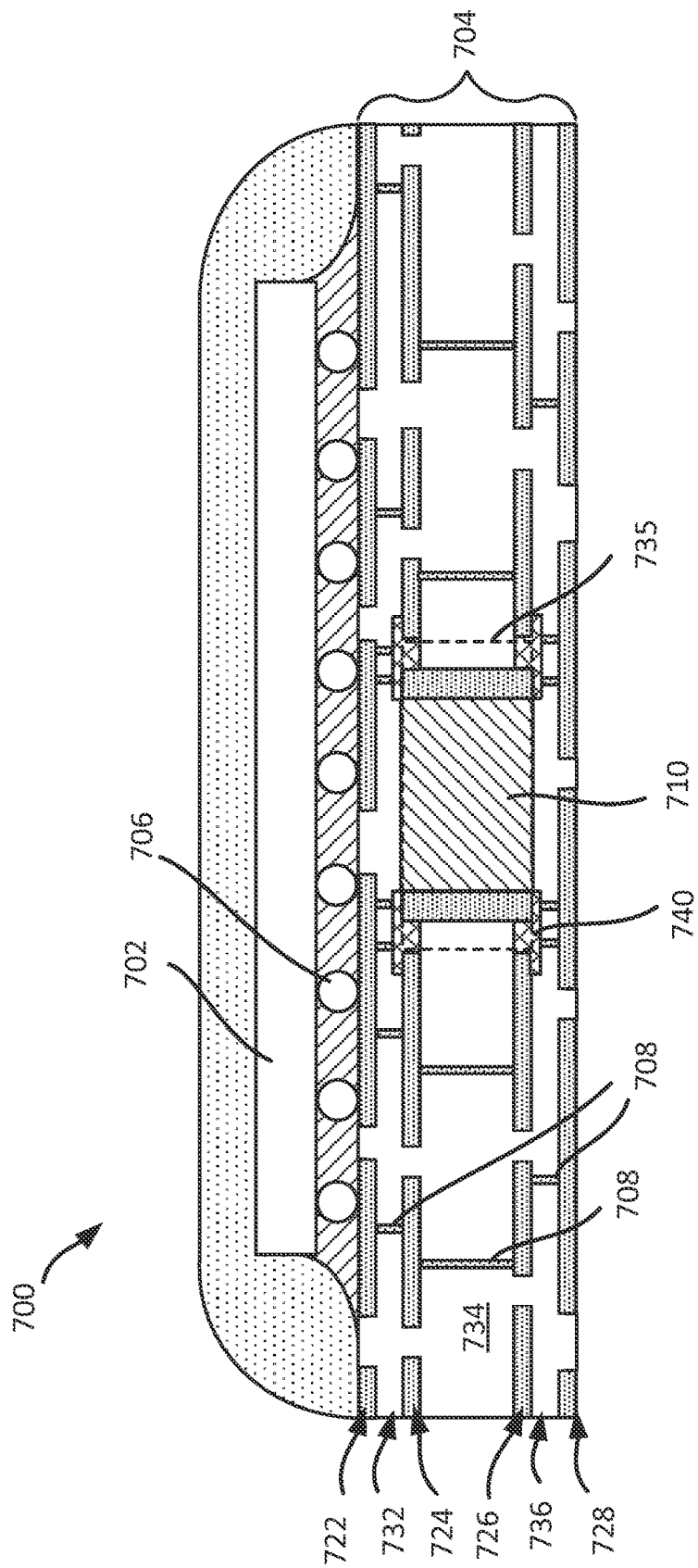
FIG. 7A illustrates a package with a capacitor structure that uses embedded package substrate (EPS).
Figure 7B:
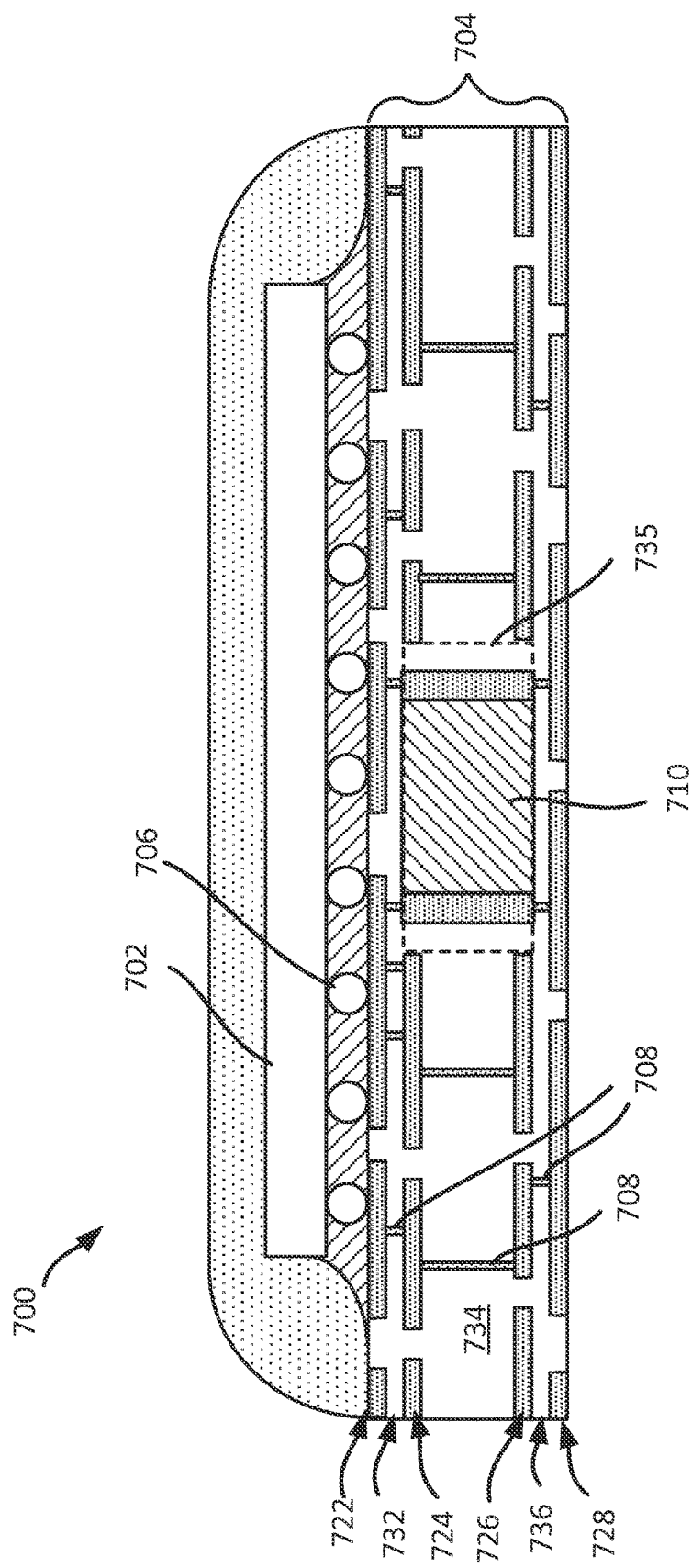
FIG. 7B illustrates another package with a capacitor structure that uses embedded package substrate (EPS).

The capacitor structure described in the present disclosure may be used in different packages. FIGS. 6 and 7A-7B illustrate some examples where a capacitor structure may be positioned in a package. FIG. 6 illustrates a capacitor structure in a package in some implementations. Specifically, FIG. 6 illustrates a device 600 that includes a printed circuit board (PCB) 602, a voltage regulator module (VRM) 604 and a package 606. The VRM 604 is coupled to a power source via a route 608. FIG. 6 also illustrates that the package 606 includes a capacitor structure 610 that is coupled to a power source via a route. In some implementations, the capacitor structure 610 may be the capacitor structures described in FIGS. 1-4. The capacitor structure 610 may provide a decoupling solution (may suppress resonance) for the PDN of the device 600. In some implementations, only one capacitor structure 610 is placed/integrated in the package 606 in order to provide sufficient resonance suppression for the package 606 and/or device 600.

In some implementations, the capacitor structure may be integrated in a substrate (e.g., substrate of package).

FIGS. 7A-7B illustrate examples of a capacitor structure in a substrate in some implementations. Specifically. FIG. 7A illustrates a cross-sectional, schematic view of an IC package 700 according to one aspect of the disclosure. The IC package 700 includes an IC die 702 (e.g., memory circuit, processing circuit, applications processor, etc.) for an electronic device, such as, but not limited to, a mobile phone, laptop computer, tablet computer, personal computer, etc. The IC package 700, and in particular, the IC die 702 may be supplied power (e.g., provided nominal supply voltages and currents) from a power management integrated circuit (PMIC) (not shown) through a power delivery network (PDN) (portions of the PDN external to the IC package 700 are not shown) associated with the electronic device.

The IC die 702 is electrically coupled to a multi-layer package substrate 704 below it in a flip-chip style. For example, one or more soldering balls 706 may electrically couple the die 702 to metal traces located within a first metal layer 722 of the package substrate 704. According to other aspects, the IC die 702 may be wire bonded to the package substrate 704. The package substrate 704 may be, for example, a four metal layer laminate substrate. In other aspects, the package substrate 704 may have three or more metal layers, including five, six, seven, eight, nine, or ten metal layers.

The four layer package substrate 704 shown includes the first metal layer 722 (e.g., first outer metal layer), a second metal layer 724 (e.g., first inner metal layer), a third metal layer 726 (e.g., second inner metal layer), and a fourth metal layer 728 (e.g., second outer metal layer. Each of the metal layers 722, 724, 426, 428 are generally separated from one another by a plurality of insulating layers 732, 734, 736 that may be composed of one or more dielectric materials, such as, but not limited to, epoxy and/or resin. In particular, the first insulating layer 734 (e.g., core) in the middle of the package substrate 704 may be thicker than the other layers and also provides structural rigidity to the package substrate 704. A plurality of metal vertical interconnect accesses (vias) 708 electrically couple traces of the plurality of metal layers 722, 424, 426, 428 of the package substrate 404 to each other where desired.

The package substrate 704 includes a cavity 735 (indicated by the dashed line box) that houses an embedded passive substrate (EPS) discrete circuit component (DCC) 710, such as a capacitor, resistor, or inductor. In some implementations, the EPS discrete circuit component is the capacitor structure described herein (e.g., capacitor structure of FIGS. 4A-4B). It should be noted that the DCC 710 is a conceptual representation of a DCC and does not necessarily represent exactly how the DCC (e.g., capacitor structure) is formed and coupled in the substrate. Rather, the DCC 710 in FIGS. 7A and 7B is merely intended to show a possible location of a DCC in a substrate. Different implementations may use different configurations and designs to couple the electrodes of the DCC to the vias in the substrate. For example, a first electrode (which is coupled to a first conductive layer) for the DCC may be coupled to the top left vias while a second electrode (which is coupled to a second conductive layer) for the DCC may be coupled to the top right vias in some implementations.

The cavity 735 may occupy or be located within a portion of the first insulator layer 734, and also one or more of the inner metal layers 724, 726. In the illustrated example, the DCC 710 may be, for example, a discrete capacitor (e.g., "decoupling capacitor"). According to one aspect, the discrete capacitor 710 helps reduce the impedance at a range of frequencies of the PDN by balancing inductive components of the impedance due to the IC package 700 (e.g., inductance caused by traces, vias, metal lines, etc. associated with the package substrate 704). The package substrate 704 may have a plurality of cavities each housing a separate EPS discrete circuit component.

Among other things, the package substrate 704 may comprise one or more via coupling components (e.g., via coupling component 740) that are electrically coupled to electrodes of the DCC 710. The via coupling components serve as a means for increasing the available surface area to which a plurality of vias may couple to (e.g., a first end of each via may couple to the via coupling components). The via coupling components are composed of a conductive material, such as a metal or metal alloy (e.g., copper, aluminum, and/or titanium nitride, etc.). According to one aspect, the via coupling components are made of one or more of the same metals that comprise the inner metal layers 724, 726.

According to one aspect, a first via coupling component is electrically coupled to both a first electrode of the DCC 710 and a first metal trace within the first inner metal layer 724; a second via coupling component is electrically coupled to both the first electrode and a second metal trace within the second inner metal layer 726; a third via coupling component is electrically coupled to both a second electrode of the DCC 710 and a third metal trace within the first inner metal layer 724; a fourth via coupling component is electrically coupled to both the second electrode and a fourth metal trace within the second inner metal layer 726.

Each of the aforementioned metal traces may be electrically coupled to a power or ground plane associated with the package substrate 704. For example, the first metal trace may be electrically coupled to the second metal trace by means of a via, and the third metal trace may be electrically coupled to the fourth metal trace by means of another via. In this fashion, the via coupling components may be electrically coupled to power or ground planes within the first and second inner metal layers 724, 726, wherein the first and second inner metal layers are closer to the first insulator layer 734 than the outer metal layers 722, 728.

According to one aspect, a first portion of the first via coupling component extends beyond a first edge of the first electrode of the DCC 710. According to another aspect, a second portion of the first via coupling component is positioned within the first inner metal layer 724. Similarly, a first portion of the second via coupling component may extend beyond a second edge of the first electrode, and a second portion of the second via coupling component may be positioned within the second inner metal layer 726. According to one aspect, a first portion of the third via coupling component extends beyond a first edge of the second electrode of the DCC 710. According to another aspect, a second portion of the third via coupling component is positioned within the first inner metal layer 724. Similarly, a first portion of the fourth via coupling component may extend beyond a second edge of the second electrode, and a second portion of the fourth via coupling component may be positioned within the second inner metal layer 726.

FIG. 7B illustrates a capacitor structure in another substrate in some implementations. FIG. 7B is similar to FIG. 7A. However, one difference between FIGS. 7A and 7B is that in FIG. 7B, the substrate 704 does not include one or more via coupling components (e.g., via coupling component 740 of FIG. 7A).

Having described configurations of a novel capacitor structure, a method for manufacturing such a capacitor structure will now be described below.

Exemplary Method for Manufacturing a Capacitor Structure

Figure 8:
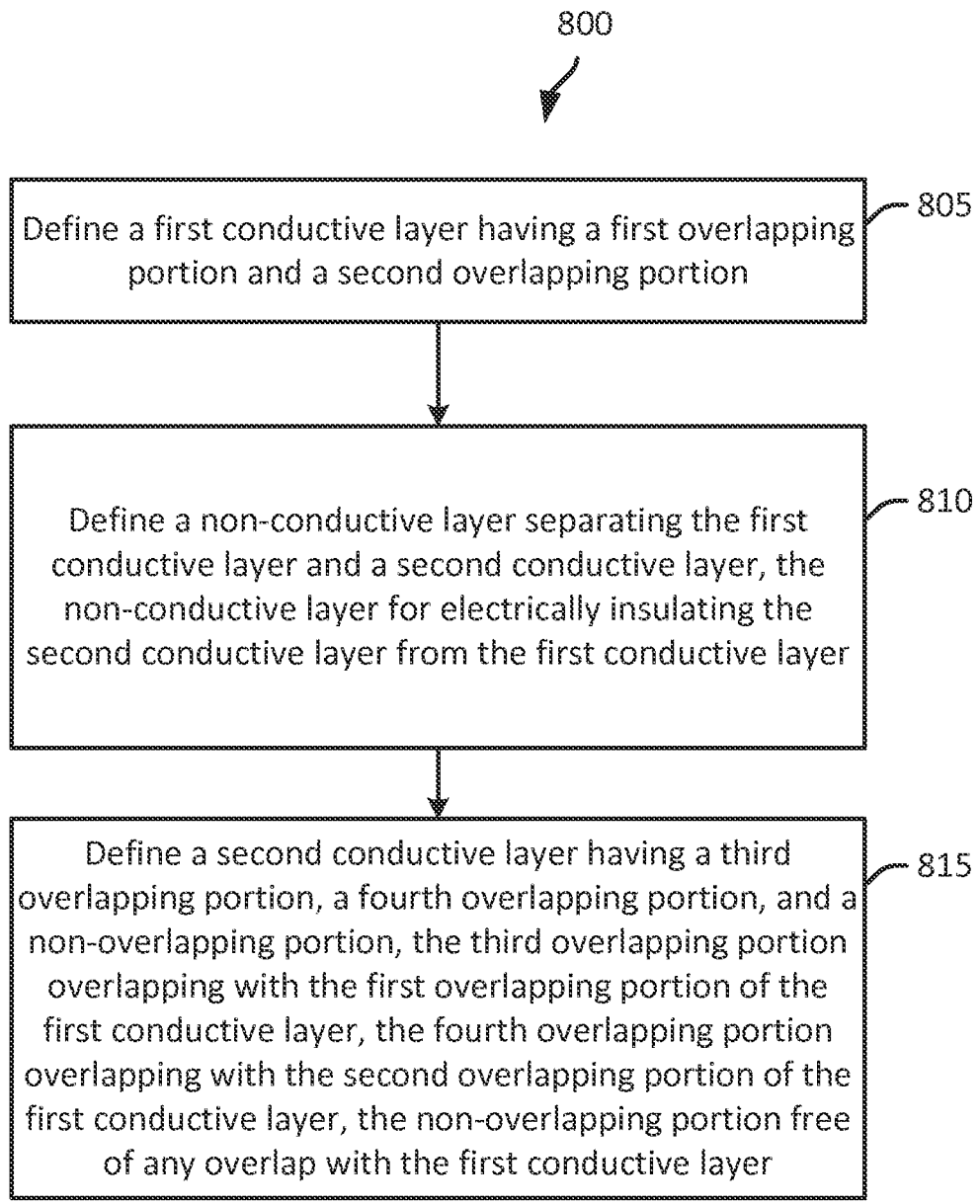
FIG. 8 illustrates a flow diagram of an overview for a method for manufacturing a capacitor structure.

FIG. 8 illustrates a flow diagram of a high level method for manufacturing a capacitor structure described in the present disclosure. After describing the high level method for manufacturing the capacitor structure, a more detailed method for manufacturing the capacitor structure will be described.

As shown in FIG. 8, the method for manufacturing the capacitor structure starts by defining (at 805) a first conductive layer for the capacitor structure. The first conductive layer has a first overlapping portion and a second overlapping portion. The first conductive layer may be a metal layer (e.g., copper). Different implementations may define the size and shape of the first conductive layer differently. Next, the method defines (at 810) a non-conductive layer separating the first conductive layer and a second conductive layer. The non-conductive layer may be for electrically insulating the second conductive layer from the first conductive layer. In some implementations, defining the non-conductive layer may include defining a set of non-conductive elements. The set of non-conductive elements may separate the first conductive layer and the second conductive layer.

Next, the method defines (at 815) the second conductive layer for the capacitor structure and ends. The second conductive layer may include a third overlapping portion, a fourth overlapping portion, and a non-overlapping portion. The third overlapping portion may overlap with the first overlapping portion of the first conductive layer. The fourth overlapping portion may overlap with the second overlapping portion of the first conductive layer. The non-overlapping portion may be free of any overlap with the first conductive layer in some implementations.

In some implementations, defining a layer (e.g., conductive layer, non-conductive layer) may include manufacturing and/or depositing the layer).

Having provided a brief overview of a method for manufacturing a capacitor structure, a more detailed method for manufacturing such a capacitor structure will now be described below.

Figure 9:
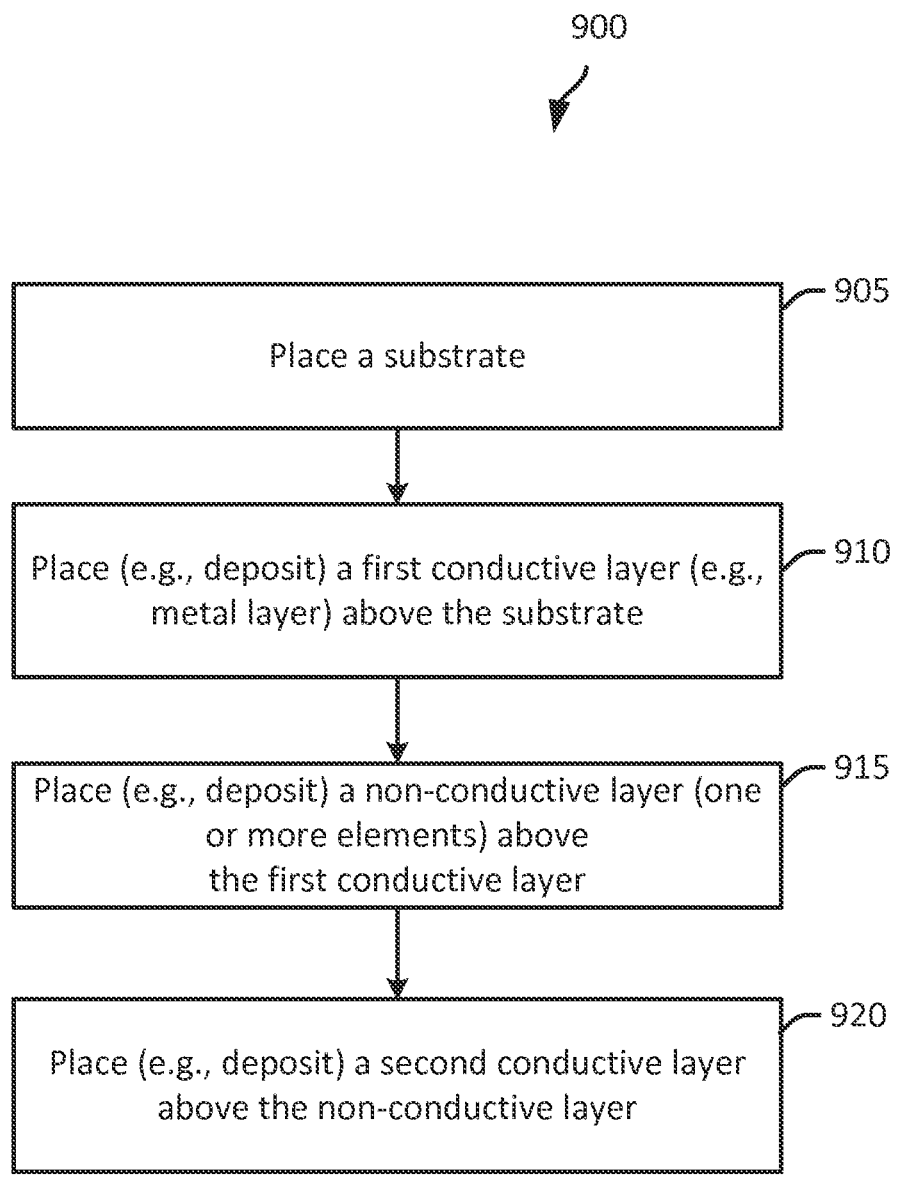
FIG. 9 illustrates a flow diagram of a method for manufacturing a capacitor structure.

FIG. 9 illustrates a flow diagram for manufacturing a capacitor structure in some implementations. As shown in FIG. 9, the method begins by placing (at 905) a substrate as the base for the capacitor structure. Different implementations may use different substrate materials (e.g., silicon, glass). Next, the method (at 910) places a first conductive layer (e.g., metal layer) above the substrate. The conductive layer that is placed may include a first conductive layer and a second conductive layer (e.g., conductive layers 102, 108 of FIG. 4B). The placing of the conductive layer may be performed in one of many ways. Examples of methods for placing a conductive layer include a deposition process, a patterning process and/or a removal process.

In some implementations, the deposition process is a process that grows, coats, or transfers a material onto the substrate. Examples of deposition processes include physical vapor deposition (PVD) (sputtering and evaporation), chemical vapor deposition (CVD), electrochemical deposition (ECD), molecular beam epitaxy (MBE) and atomic layer deposition (ALD). Some implementations may also use thin film manufacturing processes for placing the first conductive layer.

The patterning process is a process that changes the shape of the material that has been deposited during the deposition process in some implementations. The patterning process may include applying and removing a dry film resist (DFR) and using lithography to change the shape of the deposited material (e.g., deposited layer).

In some embodiments, the removal process is a process of removing material that has been deposited. Examples of removal processes include etching, which may be done chemically and/or mechanically.

Next, the method places (at 915) a non-conductive layer above the first conductive layer. In some implementations, placing the non-conductive layer may include placing a first non-conductive element and a second conductive element above the first conductive layer. The placing of the non-conductive layer may also include the placing a non-conductive layer on the same layer as the conductive layer that was placed during at 910 (e.g., non-conductive layer 106 of FIG. 4B). In some implementations, the placing of the non-conductive layer may be performed using any of the manufacturing and/or processing techniques described above for the first conductive layer.

After placing (at 915) the non-conductive layer, the method places (at 920) a second conductive layer above the non-conductive layer and ends. In some implementations, placing (at 920) the second conductive layer may include placing portions of the second conductive layer on a first layer, a second layer, and/or a third layer of a die. Different implementations may place the second conductive layer on the die differently.

In some implementations, the method of FIG. 9 may also define and/or place pins to the capacitor structure. The pins may be placed in a first conductive layer and the second conductive layer. In some implementations, a first pin is placed in a non-overlapping portion/region/area of the first conductive layer, while a second pin is placed in a non-overlapping portion/region/area of the second conductive layer.

The above disclosure describes one of many configurations for a capacitor structure with wideband resonance suppression for a power delivery network. However, different implementations may utilize different configurations. For example, although only two layers are shown, it should be clear to those of ordinary skill in the art that, based upon the description contained herein, multiple sets of first and second conductive layers (e.g., first and second conductive layer 102, 108) may be stacked together to form a sandwich structure. Further, multiple layers of non-conductive elements may be used in between the layers of each set of the first and second conductive layer, as well as between each set of the first and second conductive layers.

Moreover, it should be noted that the specific shapes of the first and second conductive layers are not critical, and any shapes that allow at least two overlapping areas/portions between the first and second conductive layers may be chosen. Although the first conductive layer is shown as a bottom layer and the second conductive layer is shown as a top layer, in some implementations, the first conductive layer is a top layer and the second conductive layer is bottom layer.

Figure 10:
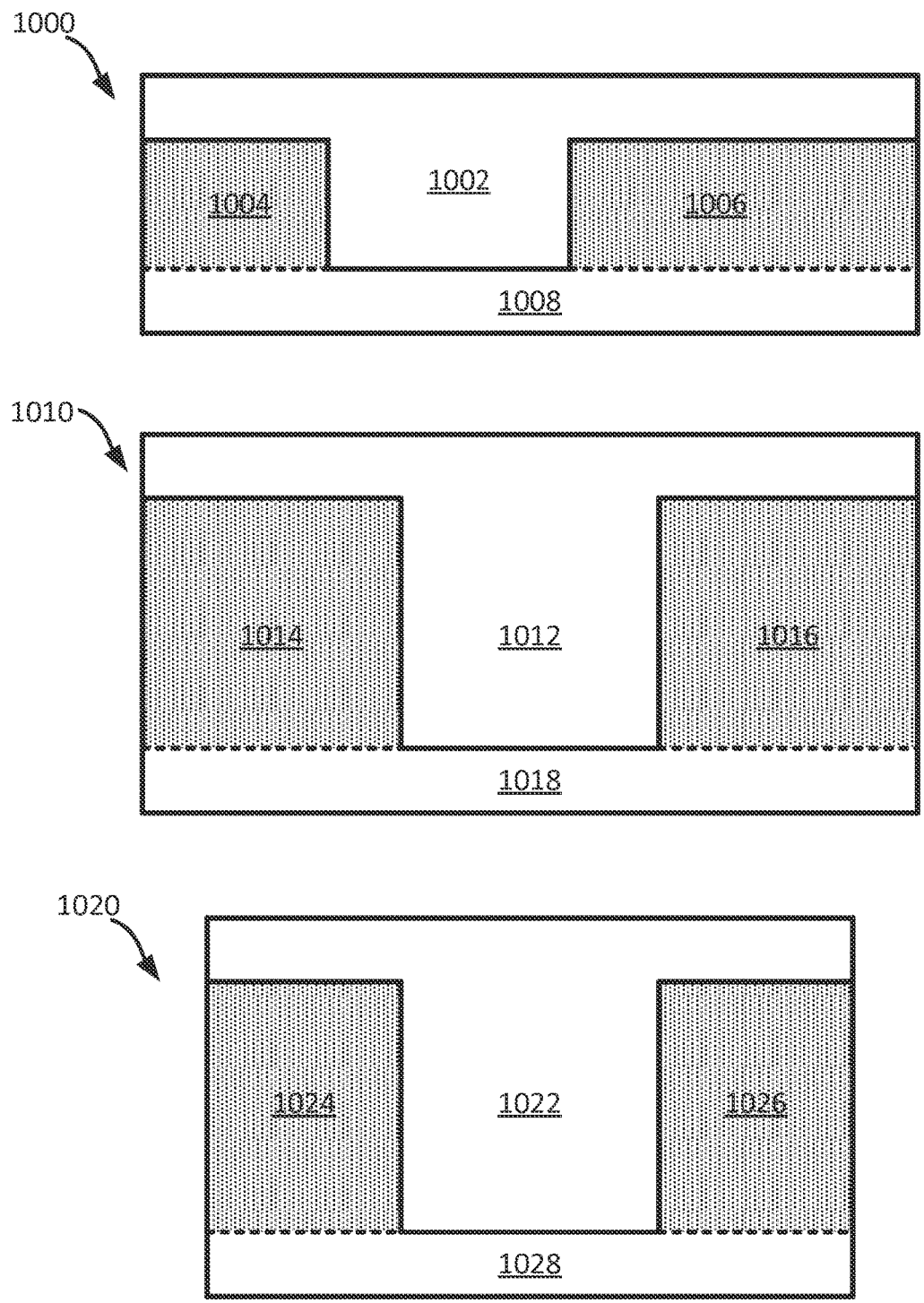
FIG. 10 illustrates capacitor structures with different shapes and sizes.

In some implementations, the shape of two non-conductive elements may be matched to ensure non-conductivity between the overlapping areas between the first and second conductive layers. In addition, the shape of the non-conductive elements may be different than those illustrated in FIGS. 1-4 (i.e., the non-conductive elements may have any shape). FIG. 10 illustrates examples of different possible configurations of the capacitor structures. Specifically, FIG. 10 illustrates examples of three different capacitor structures 1000, 1010 and 1020 with different non-conductive elements and/or non-continuous overlapping portions. As shown in this figure, the capacitor structure 1000 includes a first non-conductive element 1004 that is smaller than a second non-conductive element 1006. The capacitor structure 1010 includes a first non-conductive element 1014 and a second non-conductive element 1016 with a square shape. Finally, FIG. 10 illustrates a capacitor structure 1020 that includes a first non-conductive element 1024 and a second non-conductive element 1026 that has a length that is longer than its width.

Figure 11:
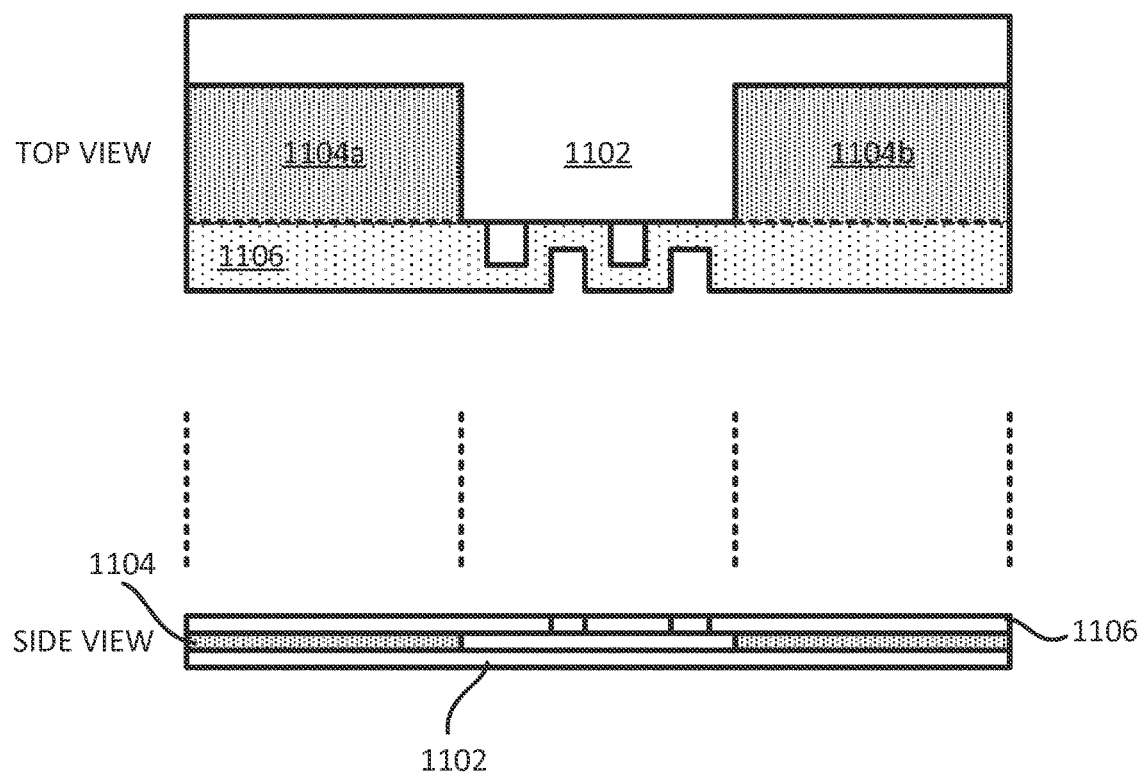
FIG. 11 illustrates a capacitor structure that includes a non-linear inductive component.

In some implementations, portions of the non-overlapping of the conductive layers may have non-uniform, and/or non-linear shapes. FIG. 11 illustrates an example of a capacitor structure that has a conductive layer with a non-linear shape. FIG. 11 is similar to FIG. 3, except that a portion of the non-overlapping region of the conductive layer 1106 is non-linear. As shown in FIG. 11, a portion of the vertically non-overlapping region of the conductive layer 106 has a zigzag pattern. Other implementations may use other non-linear patterns. In some implementations, the non-linear portion of the conductive layer 1106 may be located on the third layer of a die and/or the first layer of the die (e.g., on the same layer as the first conductive layer 1102).

Figure 12:
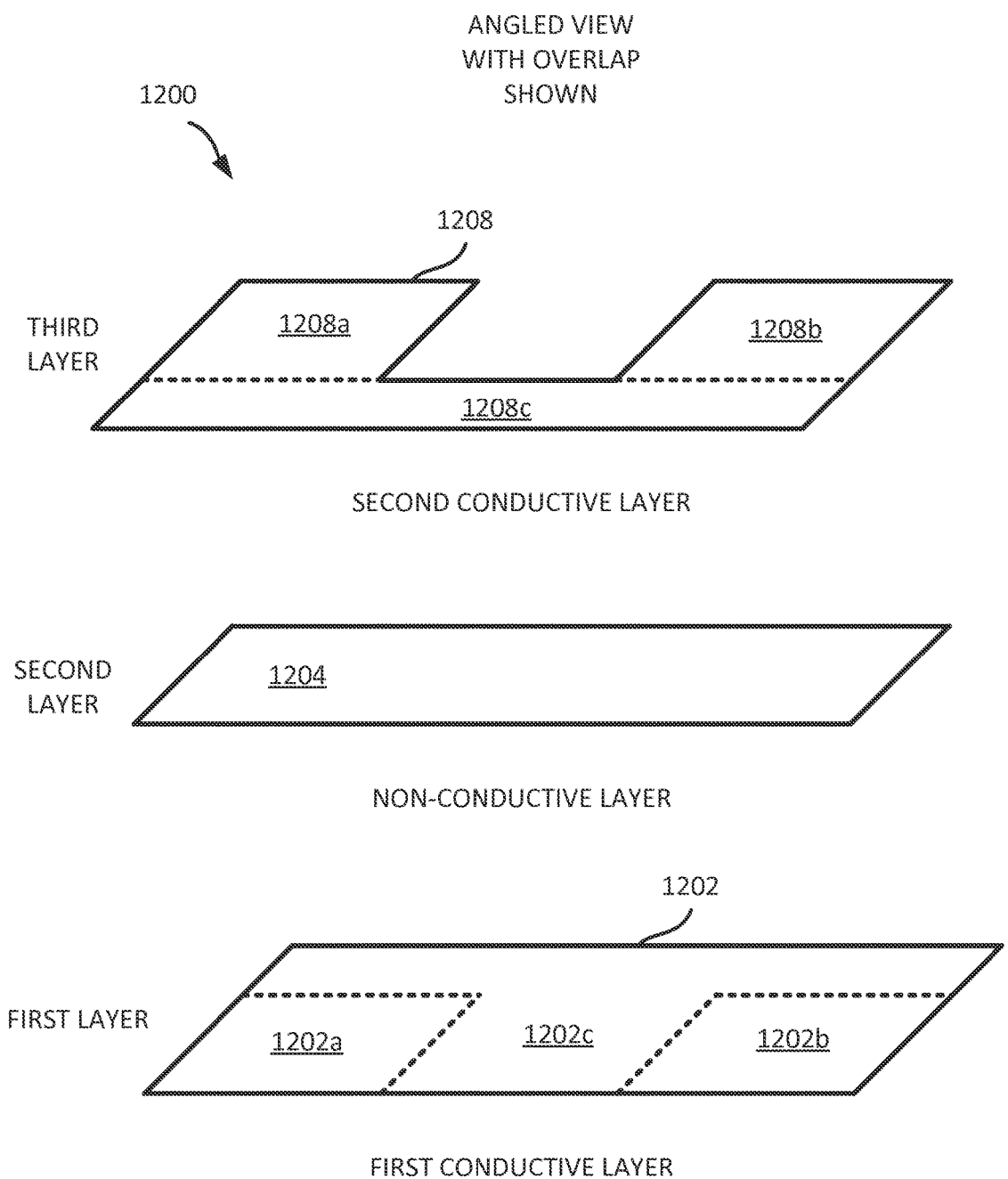
FIG. 12 illustrates a capacitor structure without a patterned non-conductive layer.
Figure 13:
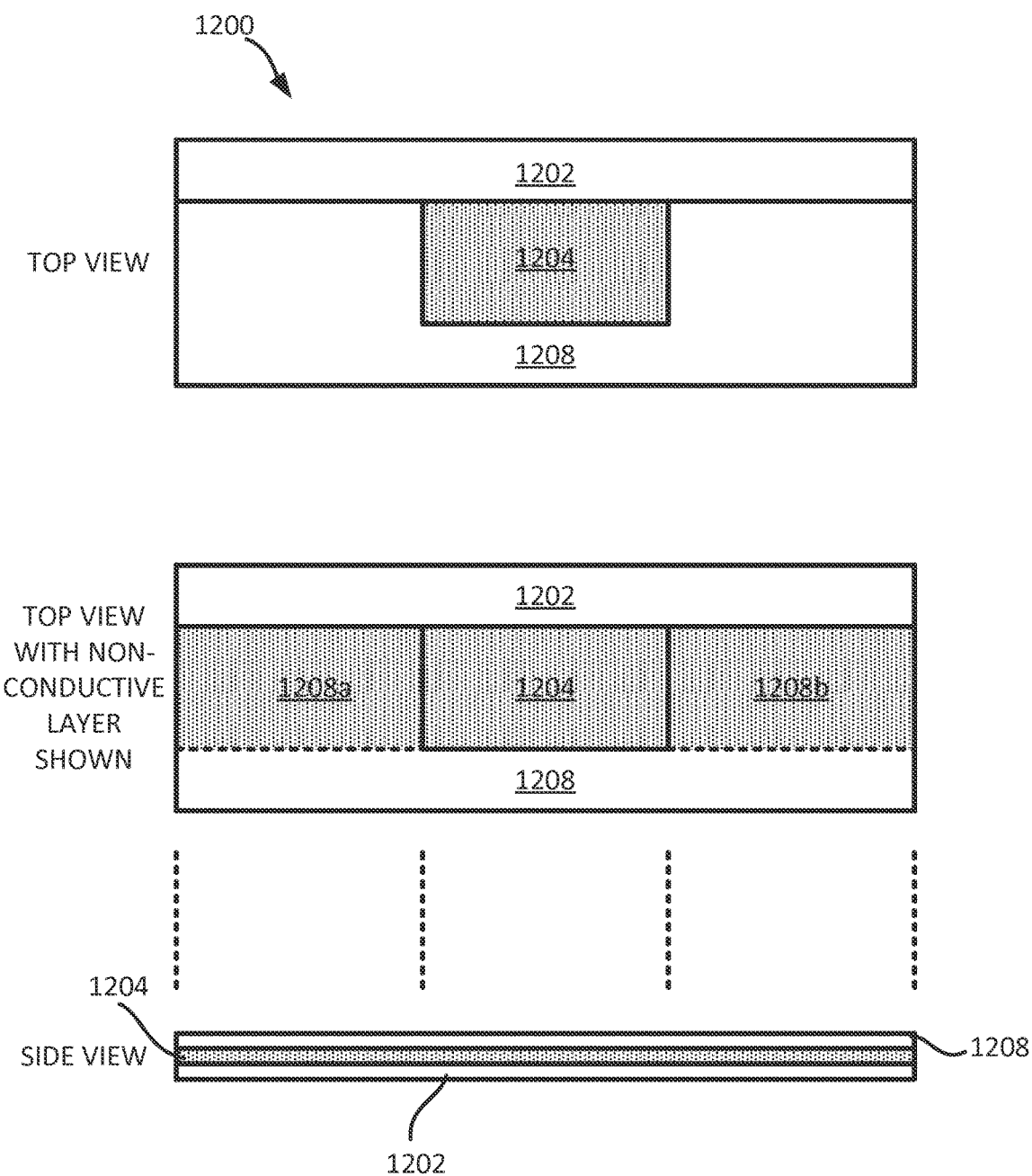
FIG. 13 illustrates a top and side view of a capacitor structure without a patterned non-conductive layer.
Figure 14:
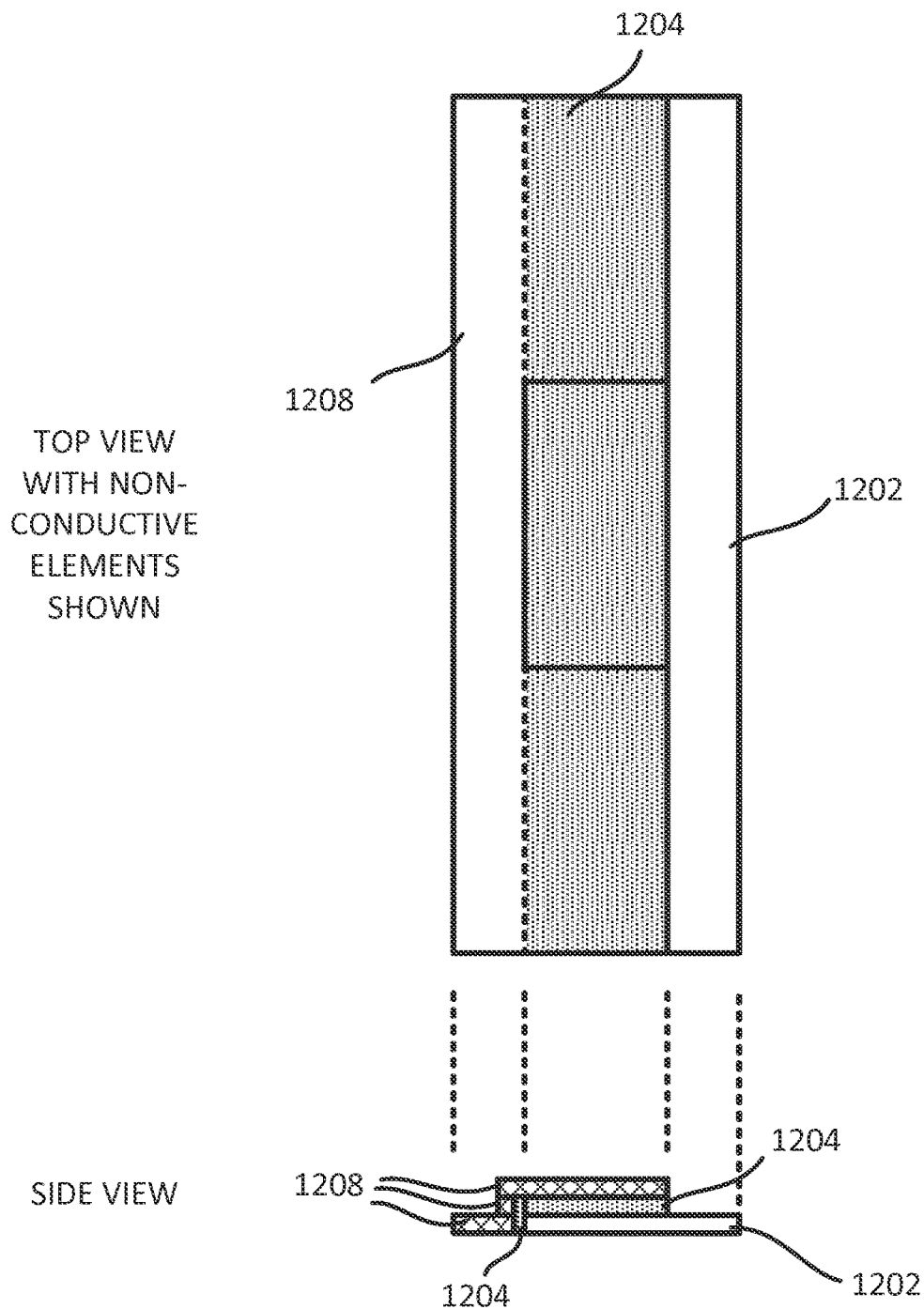
FIG. 14 illustrates another top and side view of a capacitor structure without a patterned non-conductive layer.

In some implementations, the non-conductive layer of the capacitor structure may be one continuous layer. That is, the non-conductive layer between the first and second conductive layer may not necessarily be patterned or separated (e.g., during a manufacturing process). FIGS. 12-14 illustrate examples of a capacitor structure with a continuous non-conducting layer. As shown in FIGS. 12-14, the non-conductive layer 1204 spans the entire layer without any gaps between the portions and/or regions of overlap between the first conductive layer 1202 and the second conductive layer 1208. However, the continuous non-conductive layer 1204 need not span the entire layer in some implementations.

As shown in FIGS. 12 and 13, the first conductive layer 1202 includes a first overlapping portion 1202a, a second overlapping portion 1202b, and a third portion 1202c. The second conductive layer 1208 includes a fourth overlapping portion 1208a, a fifth overlapping portion 1208b, and a non-overlapping portion 1208c. The first overlapping portion 1202a of the first conductive layer 1202 overlaps with the fourth overlapping portion 1208a of the second conductive layer 1208. Similarly, the second overlapping portion 1202b of the first conductive layer 1202 overlaps with the fifth overlapping portion 1208b of the second conductive layer 1208. Some or all portions of the non-conductive layer may overlap with first and second conductive layers 1202 and 1208.

In some implementations, a first capacitor element/component (which provides capacitive properties) of the capacitor structure may be defined by the first overlapping portion 1202a of the first conductive layer 1202, a portion of the non-conductive layer 1204, and a fourth overlapping portion 1208a of the second conductive layer 1208. Similarly, in some implementations, a second capacitor element/component (which provides capacitive properties) of the capacitor structure may be defined by the second overlapping portion 1202b of the first conductive layer 1202, another portion of the non-conductive layer 1204, and a fifth overlapping portion 1208b of the second conductive layer 1208.

The non-overlapping portion 1208c of the second conductive layer 1208 does not vertically overlap (free of any vertical overlap) with the first conductive layer 1202 in some implementations. The non-overlapping portion 1208c may be located on the same layer as the second conductive layer 1208 (e.g., above the first conductive layer 1202 and the non-conductive layer 1204) in some implementations. In other implementations, some or all portions of the non-overlapping portion 1208c may be located on the same layer as the first conductive layer 1202 (e.g., See FIG. 14). In some implementations, the non-overlapping portion 1208 may provide inductive properties for the capacitor structure.

Figure 15:
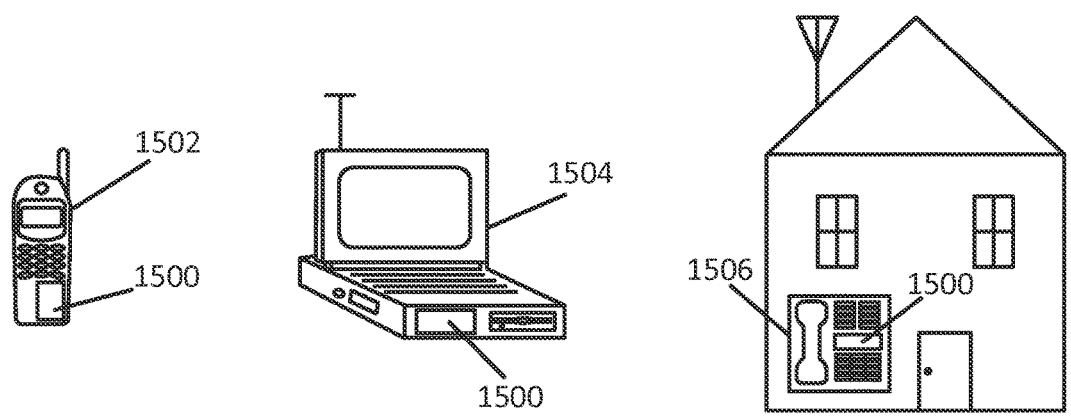
FIG. 15 illustrates various electronic devices that may integrate the IC or die described herein.

The above capacitor structure may be implemented in various electronic devices. FIG. 15 illustrates various electronic devices that may be integrated with any of the aforementioned integrated circuit, die, chip or package. For example, a mobile telephone 1502, a laptop computer 1504, and a fixed location terminal 1506 may include an integrated circuit (IC) 1500 having a central thermal management unit. The IC 1500 may be, for example, any of the integrated circuits, dice or packages described herein. The devices 1502, 1504, 1506 illustrated in FIG. 15 are merely exemplary. Other electronic devices may also feature the IC 1500 including, but not limited to, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof.

One or more of the components, steps, features, and/or functions illustrated in FIGS. 1, 2, 3, 4A, 4B, 5, 6, 7A, 7B, 8, 9, 10, 11, 12, 13, 14 and/or 15 may be rearranged and/or combined into a single component, step, feature or function or embodied in several components, steps, or functions. Additional elements, components, steps, and/or functions may also be added without departing from the invention.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A capacitor structure comprising:
a first conductive layer having a first overlapping portion and a second overlapping portion integrally connected by a first non-overlapping portion having a generally T-shaped configuration in a plan view;
a second conductive layer having a third overlapping portion and a fourth overlapping portion integrally connected to a second non-overlapping portion extending along bottom edges of the third and fourth overlapping portions, the third overlapping portion overlapping with the first overlapping portion of the first conductive layer, the fourth overlapping portion overlapping with the second overlapping portion of the first conductive layer, the second non-overlapping portion free of any overlap with the first conductive layer; and
a non-conductive layer separating the first and second conductive layers, the non-conductive layer electrically insulating the third overlapping portion and the fourth overlapping portion from the first conductive layer; and
wherein the first non-overlapping portion is free of any overlap with the non-conductive layer.

2. The capacitor structure of claim 1, wherein the non-conductive layer comprises a first non-conductive element and a second non-conductive element, the first non-conductive element arranged in the capacitor structure so as to overlap with the third overlapping portion of the second conductive layer, the second non-conductive element arranged in the capacitor structure so as to overlap with the fourth overlapping portion of the second conductive layer.

3. The capacitor structure of claim 1, wherein the first conductive layer, the non-conductive layer, and the second conductive layer are configured to form a single embedded passive substrate (EPS) element with capacitive properties.

4. The capacitor structure of claim 1, wherein at least a portion of the non-overlapping portion of the second conductive layer is on the same layer as the first conductive layer.

5. The capacitor structure of claim 1, wherein the non-overlapping portion of the second conductive layer has an inductive property.

6. The capacitor structure of claim 5, wherein the inductive property of the non-overlapping portion of the second conductive layer is based on a non-linear shape of the non-overlapping portion of the second conductive layer.

7. The capacitor structure of claim 1, wherein the non-conductive layer includes a dielectric material.

8. The capacitor structure of claim 1, wherein the first overlapping portion of the first conductive layer, a first portion of the non-conductive layer, and the third overlapping portion of the second conductive layer has a first capacitive property.

9. The capacitor structure of claim 8, wherein the second overlapping portion of the first conductive layer, a second portion of the non-conductive layer, and the fourth overlapping portion of the second conductive layer has a second capacitive property.

10. The capacitor structure of claim 1, wherein the first conductive layer, the second conductive layer, and the non-conductive layer are layers of a die.

11. A method for manufacturing a capacitor structure, comprising:
defining a first conductive layer having a first overlapping portion and a second overlapping portion integrally connected by a first non-overlapping portion having a generally T-shaped configuration in a plan view;
defining a non-conductive layer separating the first conductive layer and a second conductive layer, the non-conductive layer for electrically insulating the second conductive layer from the first conductive layer; and
defining a second conductive layer having a third overlapping portion and a fourth overlapping portion integrally connected to a second non-overlapping portion extending along bottom edges of the third and fourth overlapping portions, the third overlapping portion overlapping with the first overlapping portion of the first conductive layer, the fourth overlapping portion overlapping with the second overlapping portion of the first conductive layer, the second non-overlapping portion free of any overlap with the first conductive layer; and
wherein the first non-overlapping portion is free of any overlap with the non-conductive layer.

12. The method of claim 11, defining the non-conductive layer comprises defining a first non-conductive element and a second non-conductive element, the first non-conductive element arranged in the capacitor structure so as to overlap with the third overlapping portion of the second conductive layer, the second non-conductive element arranged in the capacitor structure so as to overlap with the fourth overlapping portion of the second conductive layer.

13. The method of claim 11, wherein the first conductive layer, the non-conductive layer, and the second conductive layer are configured to form a single embedded passive substrate (EPS) element with capacitive properties.

14. The method of claim 11, wherein the non-overlapping portion of the second conductive layer has an inductive property.

15. The method of claim 14, wherein the inductive property of the non-overlapping portion of the second conductive layer is based on a non-linear shape of the non-overlapping portion of the second conductive layer.

16. The method of claim 11, wherein the non-conductive layer includes a dielectric material.

17. The method of claim 11, wherein the first overlapping portion of the first conductive layer, a first portion of the non-conductive layer, and the third overlapping portion of the second conductive layer has a first capacitive property.

18. The method of claim 17, wherein the second overlapping portion of the first conductive layer, a second portion of the non-conductive layer, and the fourth overlapping portion of the second conductive layer has a second capacitive property.

19. The method of claim 11, wherein defining the first conductive layer comprises defining the first conductive layer on a first layer of a die.

20. The method of claim 19, wherein defining the non conductive layer comprises defining the non conductive layer on a second layer of a die.

21. The method of claim 20, wherein defining the second conductive layer comprises defining the second conductive layer on a third layer of a die.

22. The method of claim 20, wherein defining the second conductive layer comprises defining the first and second overlapping portions of the first conductive layer on a third layer of a die and defining some or all of the non-overlapping portion on the first layer of the die.

23. An apparatus for manufacturing a capacitor structure, comprising:
means for defining a first conductive layer having a first overlapping portion and a second overlapping portion integrally connected by a first non-overlapping portion having a generally T-shaped configuration in a plan view;
means for defining a non-conductive layer separating the first conductive layer and a second conductive layer, the non-conductive layer for electrically insulating the second conductive layer from the first conductive layer; and
means for defining a second conductive layer having a third overlapping portion and a fourth overlapping portion integrally connected to a second non-overlapping portion extending along bottom edges of the third and fourth overlapping portions, the third overlapping portion overlapping with the first overlapping portion of the first conductive layer, the fourth overlapping portion overlapping with the second overlapping portion of the first conductive layer, the second non-overlapping portion free of any overlap with the first conductive layer; and
wherein the first non-overlapping portion is free of any overlap with the non-conductive layer.

24. The apparatus of claim 23, the means for defining the non-conductive layer comprises a means for defining a first non-conductive element and a second non-conductive element, the first non-conductive element arranged in the capacitor structure so as to overlap with the third overlapping portion of the second conductive layer, the second non-conductive element arranged in the capacitor structure so as to overlap with the fourth overlapping portion of the second conductive layer.

25. The apparatus of claim 23, wherein the first conductive layer, the non-conductive layer, and the second conductive layer are configured to form a single embedded passive substrate (EPS) element with capacitive properties.

26. The apparatus of claim 23, wherein the non-overlapping portion of the second conductive layer has an inductive property.

27. The apparatus of claim 26, wherein the inductive property of the non-overlapping portion of the second conductive layer is based on a non-linear shape of the non-overlapping portion of the second conductive layer.

28. The apparatus of claim 23, wherein the non-conductive layer includes a dielectric material.

29. The apparatus of claim 23, wherein the first overlapping portion of the first conductive layer, a first portion of the non-conductive layer, and the third overlapping portion of the second conductive layer has a first capacitive property.

30. The apparatus of claim 29, wherein the second overlapping portion of the first conductive layer, a second portion of the non-conductive layer, and the fourth overlapping portion of the second conductive layer has a second capacitive property.

* * * * *